(12) United States Patent
Kanbe et al.

(10) Patent No.: US 6,221,508 B1
(45) Date of Patent: Apr. 24, 2001

(54) MAGNETIC RECORDING MEDIA

(75) Inventors: Tetsuya Kanbe; Ichiro Tamai, both of Yokohama; Yuzuru Hosoe, Hino; Kiwamu Tanahashi, Fujisawa; Yoshio Takahashi, Koganei; Fumiyoshi Kirino, Tokyo; Nagatugu Koiso, Tama; Satoshi Matsunuma, Kamakura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/206,869

(22) Filed: Dec. 8, 1998

(30) Foreign Application Priority Data

Dec. 9, 1997 (JP) ...................................... 9-338457
Apr. 16, 1998 (JP) ................................. 10-106031

(51) Int. Cl.[7] .................................................. C23C 15/00
(52) U.S. Cl. ........................ 428/617; 427/131; 427/132; 428/336; 428/639; 428/640; 428/641; 428/662; 428/663; 428/669; 428/680; 428/693; 428/694 MT; 428/694 XS; 428/694 TS; 428/900; 428/928
(58) Field of Search .................................... 428/336, 693, 428/694 MT, 694 XS, 694 TS, 617, 639, 640, 641, 662, 663, 669, 680, 900, 928; 427/131, 132

(56) References Cited

U.S. PATENT DOCUMENTS 6,057,021 * 5/2000 Ishikawa et al. .

FOREIGN PATENT DOCUMENTS

409180150A * 7/1997 (JP) .

* cited by examiner

Primary Examiner—Bernard Pianalto
(74) Attorney, Agent, or Firm—Kenyon & Kenyon

(57) ABSTRACT

In a magnetic storage apparatus having a magnetic recording medium, a drive unit for driving this medium in a prespecified recording direction, a magnetic head assembly including a recorder section and reproduction section, means for causing the magnetic head to move relatively with respect to the magnetic record medium, and a record/playback signal processor means for performing signal inputting to the magnetic head and for effecting reproduction of an output signal from the magnetic head, the reproduction section of said magnetic head is composed of a magnetic head of the magneto-resistance effect type, while said magnetic record medium is structured including a substrate and a magnetic layer formed thereover with one or several underlayers being sandwiched therebetween, wherein at least one of the underlayers is a specific layer that is made of amorphous or microcrystalline materials containing therein Ni as the principal or main component thereof and further containing at least one kind of element as selected from the group consisting of Nb and Ta.

8 Claims, 10 Drawing Sheets

MAGNETIC RECORDING MEDIA

BACKGROUND OF THE INVENTION

The present invention relates generally to magnetic storage apparatus and, more particularly, to high-density magnetic storage devices having the recording density of more than 4 gigabits per square inch (Gbit/in$^2$). The invention also relates to magnetic recording media of low noise and high reliability with reduced reproduction output attenuation occurring due to thermomagnetic relaxation to attain high-density recordabilities required.

In recent years, as magnetic storage apparatus rapidly increases in recording density, it is demanded to attain high-sensitivity magnetic heads along with advanced magnetic storage media high in magnetic coercive force and yet low in noise. While currently available magnetic head assemblies typically employ a magnetic head of the magnetoresistance effect type, also known as magnetoresistive (MR) heads, an endless demand for increased data storage density calls for accelerated development of further advanced magnetic heads of the giant magnetoresistance (GMR) type which are two or three times greater in sensitivity than standard MR heads.

In addition, as portable or handheld personal computers (PCs) such as "notebook" PCs are sharing larger part in the digital computer market, prior known storage media with an Al—Mg alloy substrate metallized or plated with NiP (referred to as "Al substrate" hereinafter) are being replaced with glass-substrate media having enhanced physical durability or robustness against attendant shocks during hand-carrying or "on-the-fly" usage outside the users' offices, which media are under accelerated development today. Unfortunately, advantages of such glass-substrate media do not come without accompanying a penalty: these tend to decrease in magnetic properties more significantly than conventional Al-substrate media due to defective adherence, immersion or "invasion" of impurity gasses from a substrate into its associative films, degradation of in-plane orientation of magnetization easy axis, increased particle or grain sizes, and others. An approach to avoiding such problem associated with the prior art is to newly form between the substrate and an undercoat layer or underlayer more than one additive layer including an intermediate layer, seed layer, barrier layer and the like. One typical scheme incorporating this principle has been disclosed in, for example, JP-A-1-134913 (laid open on May 26, 1989). A similar scheme is set forth in JP-A-1-134984 (laid open on May 26, 1989). These Japanese documents teach and suggest that the adhesiveness might increase by formation of an intermediate layer which is made of oxide of a chosen metal containing therein at least one element as selected from the group consisting of Ti, Zr, Hf, V, Nb, Ta, Cr, Mo, W, and Mn, which leads to achievability of good contact-start-stop (CSS) characteristics. In addition, referring to JP-A-4-153910 (laid open on May 27, 1992), it is disclosed therein that formation of an amorphous or micro-crystalline film may enable miniaturization of particle or grain dimensions to thereby reduce the risk of attendant noises, which film is comprised of Y as well as one element selected from the group consisting of Ti, Zr, Hf, V, Nb, Ta, Cr, Mo, and W. JP-A-5-135343 (laid open on Jun. 1, 1993) demonstrates the fact that forming on a glass substrate an oxygen isolator layer allows resultant magnetic coercive force to increase, which layer contains therein a chosen rare earth element in addition to one kind of element selected from the group consisting of Ta, Y, Nb and Hf. Reference is further made to JP-A-7-73441 (laid open on Mar. 17, 1995), which indicates obtainability of higher coercive force by forming on a substrate either an amorphous Cr alloy or V alloy because such formation permits a Cr under-layer formed thereon to exhibit the (211) orientation causing a Co-alloy magnetic layer to have the (10.0) orientation with its magnetization easy axis facing the inside of a film surface, i.e. lying parallel to the film surface.

SUMMARY OF THE INVENTION

A layer as directly formed on a substrate for purposes of grain size control and impurity invasion elimination and so on will consistently be referred to as the first underlayer, whereas another underlayer with the body-centered cubic ("bcc") structure made of a Cr alloy or any equivalents thereto for orientation control of a magnetic epitaxial-growth layer will be as the second underlayer in the description below.

Also note that while medium noise reduction calls for miniaturization or microfabrication of magnetic particle or grain diameters along with reduction of interaction between grains for interchanging, resultant recording magnetization can decrease or attenuate with time due to the fact that miniaturized or "shrank" magnetic crystals would be affectable from thermal disturbance more significantly. This is called the "thermomagnetic relaxation," which will become significant with an increase in recording density. In light of the foregoing, in order to achieve ultrahigh recording density, it should be required to suppress or minimize any possible thermomagnetic relaxation while at the same time letting noise reduction be obtainable.

It is therefore an object of the present invention to provide an improved magnetic storage apparatus and a magnetic recording medium adaptable for use therewith.

It is another object of the invention to provide a high-density magnetic recording medium of low noise with enhanced stability against thermomagnetic relaxation as achievable through appropriate control of the crystal orientation and average grain dimension as well as grain size distribution in more than one magnetic layer used therein.

It is a further object of the invention to provide a magnetic storage apparatus high in reliability having an increased recording density of more than 4 gigabits per square inch as attainable by use of a high-sensitivity magnetic head in combination with the magnetic recording medium.

In accordance with one aspect of the instant invention, a magnetic storage apparatus is provided which includes: a magnetic recording medium having a magnetic layer formed on a substrate with a single or multiple underlayers laid between them and featured in that at least one of the underlayers is made of an amorphous or microcrystalline material which contains therein Ni as its main component and also contains at least one kind of element selected from the group consisting of Nb and Ta; a drive unit for driving the record medium in the recording direction; a magnetic head assembly consisting essentially of a recorder section and reproduction section; means for forcing the magnetic head assembly to relatively move with respect to the magnetic record medium; and, record/playback signal processor means for handling signal inputting toward the magnetic head and for performing reproduction of an output signal from the magnetic head, wherein the reproduction section of said magnetic head is configured from a magnetoresistive (MR) head.

In accordance with another aspect of the invention, a magnetic storage apparatus is provided including: a magnetic recording medium having a magnetic layer formed on a substrate with a single or multiple underlayers sandwiched therebetween, at least one of which layers is comprised of an amorphous or micro-crystalline material containing as its principal component at least one kind of element selected from the group consisting of Nb, Zr, Ta, and Mo and also containing Si therein; a drive unit for driving the record medium in the recording direction; a magnetic head assembly formed from a recorder section and reproduction section; means for forcing the magnetic head assembly to move relative to the magnetic record medium; and record/playback signal processor means for handling signal inputting to the magnetic head and for performing reproduction of an output signal from the magnetic head, wherein the reproduction section of said magnetic head is structured from an MR head.

Use of an amorphous or microcrystalline material containing Si mentioned above as the first underlayer serves advantageously to permit miniaturization of crystal grains in the second underlayer and magnetic layer, and may also offer an effect of reducing grain size distribution to thereby uniformalize the resultant grain diameter. This may in turn suppress distribution of magnetization inversion magnetic fields, thereby enabling achievement of higher magnetic coercive squareness along with enhanced overwritability. A further advantage lies in that a reduction in playback output occurring due to thermal fluctuation may be suppressed even when the average grain size is reduced. This can be said because the grain size uniformalization permits removal of extra-fine magnetic crystal grains or particles that remain much affectable from thermal fluctuation. Preferably, the Si addition amount is greater than or equal to 5 atomic-percent (at%) and yet less than, or equal to, 35 at%. Setting the Si amount out of this range is not recommendable because if the Si addition amount is less than 5 at% or greater than 35 at% then crystallization can take place or alternatively the "fatting" of crystal occurs undesirably. Especially, when the Si addition amount is set in a range of from 10 to 20 at%, resultant crystal grains are successfully downsized or miniaturized enabling achievement of extra-low noise media.

Note here that the term "amorphous" as used herein may refer in nature to a state in which no clear peak is observed by X-ray diffraction, or alternatively, halo diffraction rings are observed but not any crisp diffraction spots and clear diffraction rings by electron diffraction. In addition, the term "micro-crystalline" as used herein refers to those crystals that are less in grain size than an associated magnetic layer(s)—preferably, the average size is 8 nanometers (nm) or less.

Use of an amorphous or microcrystalline material which contains therein Ni as its main component mentioned above as the first underlayer also enables miniaturization and uniformalization of magnetic layer crystal grains, which in turn makes it possible to obtain an intended storage medium of low noise while suppressing playback output reduction occurring due to thermomagnetic relaxation. It is preferable that the addition amount of Nb be in a range of from 20 to 70 at% whereas Ta ranges from 30 to 60 at% in addition amount. Otherwise, either crystallization of the underlayer or fatting of crystal grains will occur undesirably. The magnetic layer may be further improved in miniaturization and uniformity of crystal grains when additionally doping thereinto a prespecified oxide of at least one kind of element selected from the group consisting of $Al_2O_3$, $SiO_2$, $TiO_2$, $ZrO_2$ and $Ta_2O_5$, which leads to achievability of media with further enhanced noise reduction. This is because of the fact that the phase of such added oxide remains uniform in deposition within Ni-alloys of its matrix phase, thereby permitting precise and uniform fabrication of crystal grains while letting them behave as nucleation cites. Additionally, the second underlayer of Cr or containing Cr as its main component that was formed on said first underlayer to have the body-centered cubic (bcc) structure exhibits the (100) orientation. Hence, the magnetic layer formed thereon with hexagonal closest (hcp) structure has the (11.0) orientation with its c-axis—namely magnetization easy axis—being essentially directed parallel to the film surface due to epitaxial growth. This enables achievement of increased magnetic coercive force and improved coercive squareness S* thus making it possible to attain high recording densities of 4 gigabits per square inch ($Gbit/in^2$) or more. The first underlayer of the invention is further featured in significance of the adhesiveness with glass substrates; especially, this may avoid a need to provide any extra layer used for improvement of adhesion. However, it will also be able to form a pattern of uneven configuration on a medium and then fabricate between the substrate and first underlayer a certain layer for improvement of the CSS characteristics, which may be either a continuous layer or a discontinuous layer with an ensemble of islands grown. Furthermore, the substrate may be a NiP-metallized Al-alloy substrate or alternatively an amorphous carbon substrate; in this case also, similar miniaturization and uniformalization of crystal grains in the magnetic layer have been affirmed as in the case of the glass substrate, which results in accomplishment of medium noise reduction while attaining suppressibility of thermomagnetic relaxation.

The second underlayer that is formed on the first underlayer for orientation control of the epitaxial-growth magnetic layer may be made of an alloy of the bcc structure which is of pure Cr or contains Cr as its principal component and which further contains therein Ti, V, Mo or the like. Optionally, the second underlayer may be formed from a lamination of two or more layers each having the bcc structure.

Although an alloy of the hcp structure with Co being as its main component is employable for the magnetic layer, it is preferable in order to obtain higher coercive force that the magnetic layer be made of a Co alloy containing Pt therein. It will also be acceptable to employ magnetic alloys containing a rare earth metal element or elements with high magneto crystalline anisotropy, including but not limited to SmCo or FeSmN. It is further noted that the magnetic layer could be formed from a single-layer or multiple layers with a nonmagnetic intermediate layer being sandwiched between adjacent ones of them; in the latter case, the thickness t of such magnetic layer in "Brxt" product as described below is defined to equal to the total sum of thicknesses of respective magnetic layers used. In regard to magnetic characteristics of the magnetic layer, the coercive force as measured upon application of a magnetic field in the recording direction is preferably set at 2 kilo-oersteds (kOe) or greater whereas a product Brxt of the residual magnetic flux density Br and film thickness t is designed so that it falls within a range of 40 to 120 Gauss-microns. With such value settings, it will become expectable to attain superior recording/reproduction (read/write) characteristics in those regions of recording densities of more than 4 $Gbit/in^2$. If otherwise the coercive force is below 2,000 Oe then an output undesirably decreases at high recording density (200 kFCI or more). If the value Brxt goes beyond 120 Gauss-microns then the resolution can decrease; if below 40 Gauss-microns then resultant playback output will be lowered undesirably. Especially, coercive force more than 2,400 Oe is preferable in order to obtain further low media noise at high linear density.

Further, by forming as a protective layer of the magnetic layer a carbon film of 5 nm to 30 nm thick and then providing thereon a lubrication layer with absorbabilities, such as perfluoroalkylpolyether or other suitable similar materials, to a thickness of 2 to 20 nm, it becomes possible to obtain a high-density magnetic recording medium with high reliability. Preferably, the protective layer may be a carbon film with hydrogen or nitride added thereto, or a film comprising a compound of silicon carbide, tungsten carbide, (W—Mo)—C, (Zr—Nb)—N and the like, or alternatively a mixture film of such compounds and carbon, which in turn makes it possible to successfully improve the resistance to sliding movements and the anticorrosion property.

It will also be preferable that in the MR head assembly for use with the magnetic recording apparatus stated supra, two shield layers with the MR sensor unit sandwiched between them be less than or equal to 0.30 μm in distance (shield distance). This can be said because if the shield distance goes beyond 0.30 μm then the resolution can decrease causing resultant signals to increase in phase jitter. A further advantage of the invention is that it is possible to further enhance the magnitude of net signals and thus achieve high-reliability magnetic storage apparatus with increased recording density of more than 5 Gbit/in$^2$, by letting the MR head assembly employ an MR sensor that includes multiple conductive magnetic layers each capable of generating a significant resistivity change in response to a relative change in mutual magnetization directions in the presence of an external magnetic field applied thereto, and more than one conductive nonmagnetic layer as disposed between such conductive magnetic layers to thereby utilize either the giant magnetoresistance (GMR) effect or the spin valve effect.

BRIEF DESCRIPTION OF THE DRAWINGS

FIG. 1b depicts a cross-sectional view thereof as taken along line IB—IB in FIG. 1a.

DETAILED DESCRIPTION OF THE INVENTION

Embodiment 1

Figure 1A:
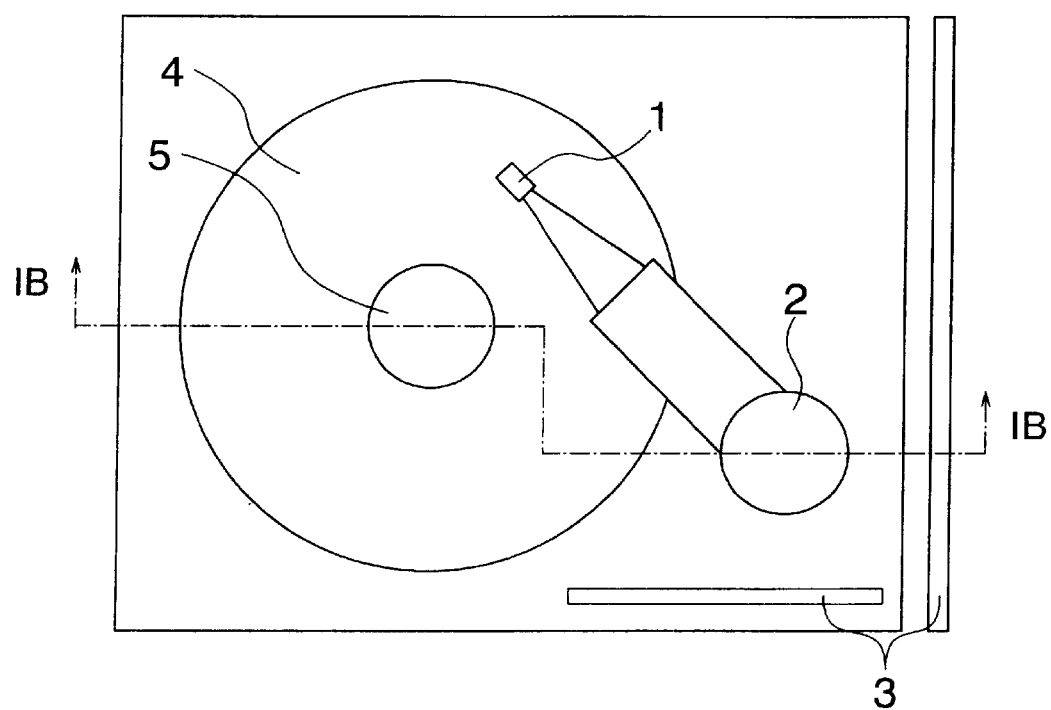
FIGS. 1a is a pictorial representation of a plan view of a magnetic storage apparatus in accordance with one preferred embodiment of the present invention.
Figure 1B:
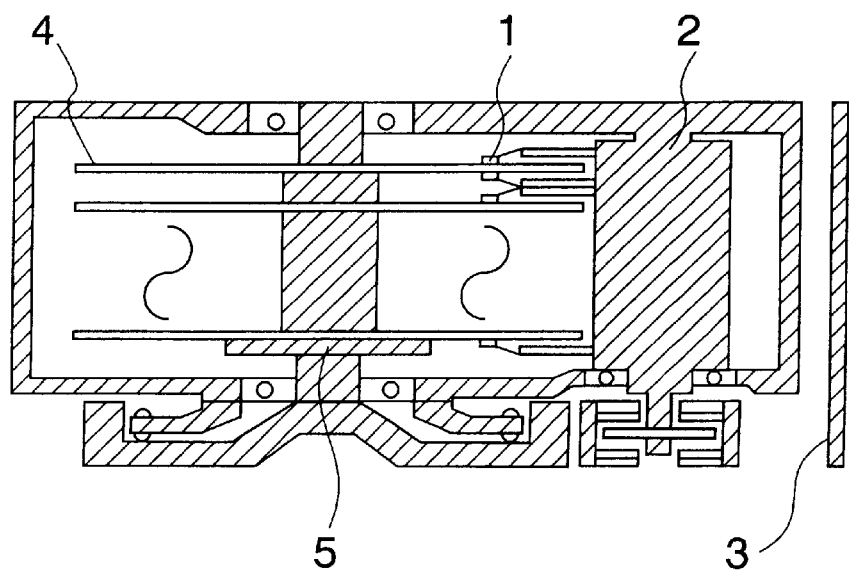

One preferred embodiment of the present invention will now be explained with reference to FIGS. 1a, 1b, 2 and 3. FIG. 1a illustrates a top view of a magnetic storage apparatus in accordance with the invention with its cover removed, while FIG. 1b depicts a cross-sectional view of the apparatus. This apparatus shown herein is a magnetic storage disk drive module which is configured from a magnetic head assembly 1, a head drive unit 2, a processor unit 3 responsible for processing of record (write) signals and playback (read) signals of the magnetic head, a magnetic recording medium 4, and a drive unit 5 for rotation of the medium 4.

Figure 2:
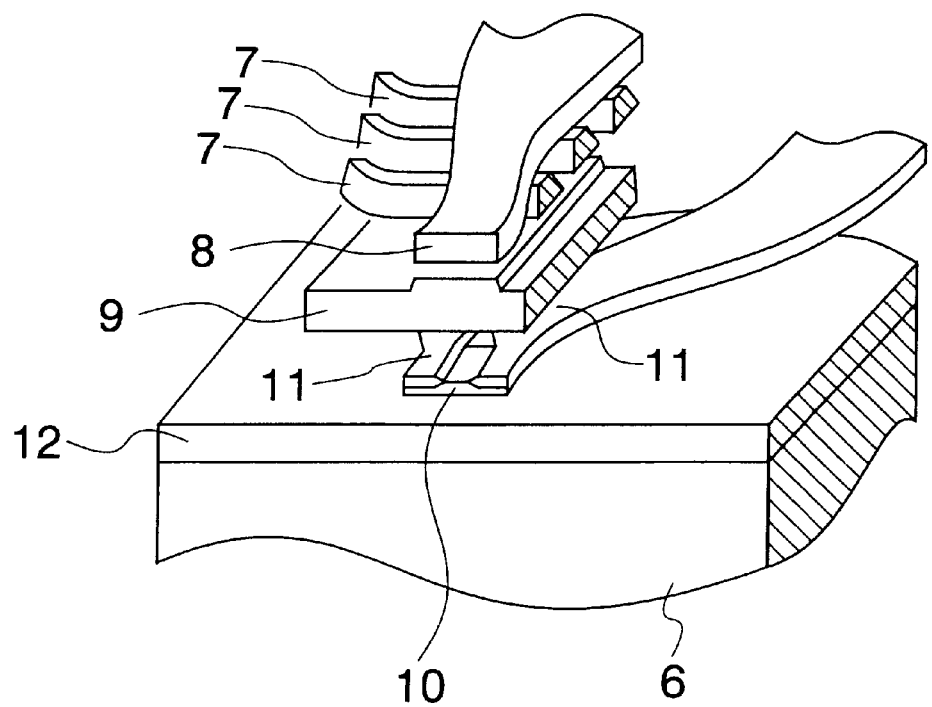
FIG. 2 is a diagram showing a perspective view of one exemplary cross-sectional structure of a magnetic head module in accordance with an embodiment of the invention.

A sectional structure of the magnetic head assembly 1 is shown in FIG. 2. This magnetic head unit is of the composite type which employs both an electromagnetic induction head for recording or "writing" information as formed on a substrate 6, and a magneto-resistive (MR) head for information reproduction or "reading." The write head is composed of a combination of an upper recording magnetic layer 8 and an upper shield layer 9 with a coil 9 laid between them, the shield layer 9 also functioning as a lower recording magnet layer. The layers 8, 9 have therebetween a gap layer of approximately 0.3 μm thick. The coil 7 is made of Cu of 3 μm thick. The read head consists essentially of an MR sensor 10 and a pair of electrode patterns 11 located on the opposite sides of MR sensor 10. MR sensor 10 is placed or "sandwiched" between the lower write magnetic/upper shield layer 9 and the lower shield layer 12, each of which is 1 μm in thickness. A gap defined between these shield layers is set at 0.25 μm. Note here that in FIG. 2, a known gap layer between the write magnetic layers and also a gap layer between the shield layer and MR sensor are eliminated from the drawings for purposes of convenience in illustration only.

Figure 3:
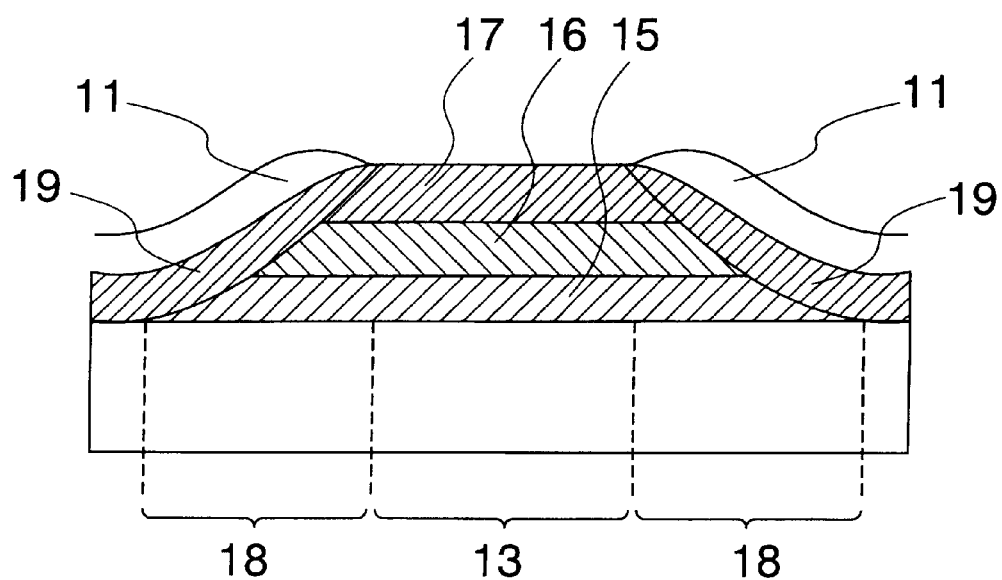
FIG. 3 is a diagrammatic representation of a sectional structure of a magnetoresistive sensor of the magnetic head in accordance with an embodiment of the invention.

FIG. 3 depicts a cross-sectional structure of the MR sensor 10. This MR sensor has a multilayered signal detection region 13, which consists essentially of a lamination of a lateral biassing layer 15 and spacer layer 16 plus MR ferromagnetic layer 17 as stacked in succession on a gap layer 14 made of aluminum oxide. The MR ferromagnetic layer 17 was made of a NiFe alloy of 20 nanometers (nm) thick. Lateral bias layer 15 was made of NiFeNb of 25 nm thick, which may alternatively be made of other similar suitable materials as far as these are those ferromagnetic alloys which are relatively high in electrical resistivity and also excellent in "soft" magnetic characteristics, such as NiFeRh for example. Upon receipt of a magnetic field as created by the flow of a sense current through the ferromagnetic layer 17, the lateral bias layer 15 is magnetized in a specified direction extending within the film surface (lateral direction) at right angles to the current flow thereby applying a lateral-direction biassing magnetic field to the ferromagnetic layer 17. With such an arrangement, the multilayer MR magnetic sensor 10 may exhibit the intended playback output that is linear relative to leakage magnetic fields from the magnetic record media 4. The spacer layer 16 is responsible for eliminating diversion of the sense current from the ferromagnetic layer 17, and is made of a Ta film with relatively high electrical resistivity as formed to a thickness of 5 nm. The signal detection region 13 has its opposite ends whereat tapered sections 18 are disposed which are machined into a preselected taper shape. Each taper section 18 is formed from a permanent magnetic layer 19 for letting ferromagnetic layer 17 have a single magnetic domain along with a pair of electrodes 11 formed on the opposite slant sidewalls of layer 17 for taking signals out of it. The permanent magnet 19 is made of a CoCr or CoCrPt alloy in view of the fact that such magnet is required to be significant in magnetic coercive force and be hardly variable in magnetization direction thereof.

Figure 4:
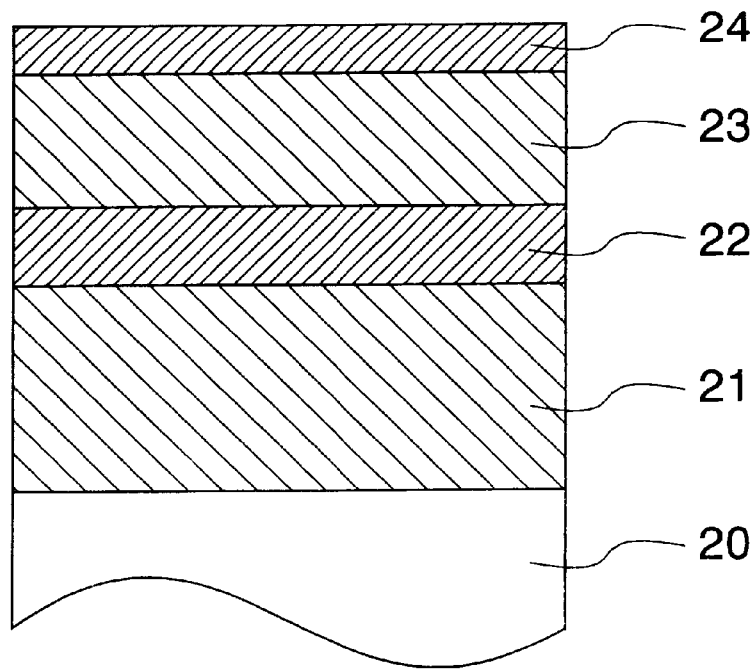
FIG. 4 is a diagrammatic representation of one example of the sectional structure of a magnetic recording medium in accordance with an embodiment of the invention.

Turning now to FIG. 4, there is depicted a multilayer structure of the magnetic record medium 4 used in this embodiment. A substrate 20 is made of soda lime glass that is chemically reinforced. The glass substrate 20 has its top surface on which a first underlayer 21 and second underlayer 22 plus magnetic layer 23 as well as protective layer 24 are laminated in this order. The first underlayer 21 is made of Ni-35at%Ta having its film thickness of 50 nm. The second underlayer 22 is a Cr-15at%Ti film of 10 nm thick. Magnetic layer 23 is a 22 nm thick Co-20at%Cr-10at%Pt alloy film. The protective layer 24 is a 10 nm carbon film. Regarding a certain medium for use in evaluation of read/write characteristics, a lubrication layer with absorbability was additionally provided which is made of perfluoroalkylpolyester or any equivalents thereto and has its thickness of from 2 to 20 nm. The medium may be manufactured in a way which follows. Firstly, prepare an alkali-washed substrate. The substrate is heated by lamp heaters up to a temperature of 300° C. After having formed thereon a first underlayer, the resultant structure is again heated to 200° C. Then, sequentially fabricate thereon a second underlayer, magnetic layer, and protective layer. Film formation for the multilayer lamination of from the first underlayer to protective layer was continuously performed in a vacuum. All the films were fabricated by DC sputtering techniques in an Ar gas atmosphere at 10 mTorr.

Figure 5:
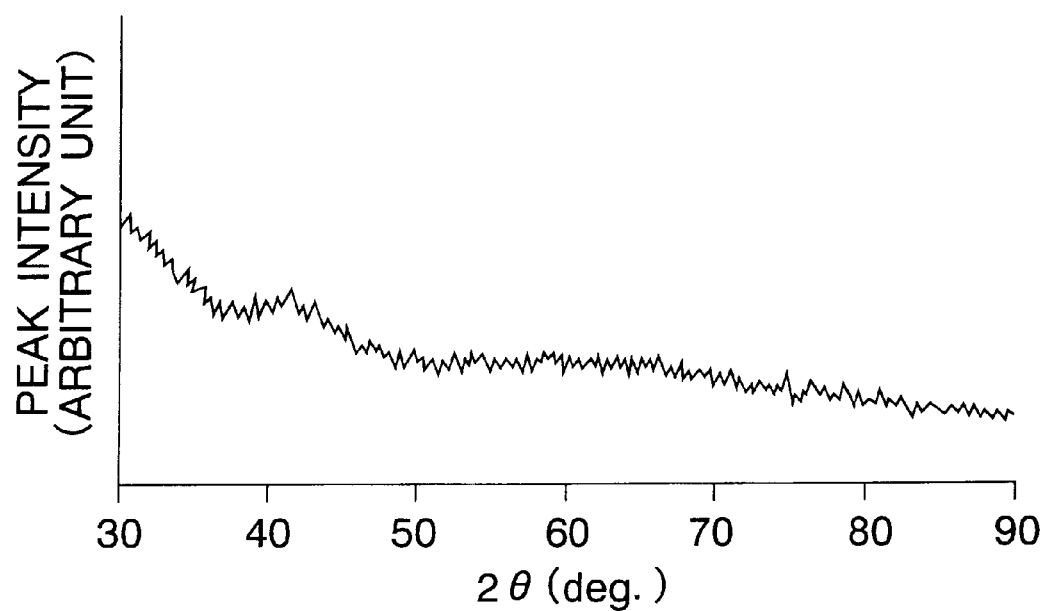
FIG. 5 is a graph showing an X-ray diffraction profile of a single first underlayer in one embodiment of the invention.
Figure 6:
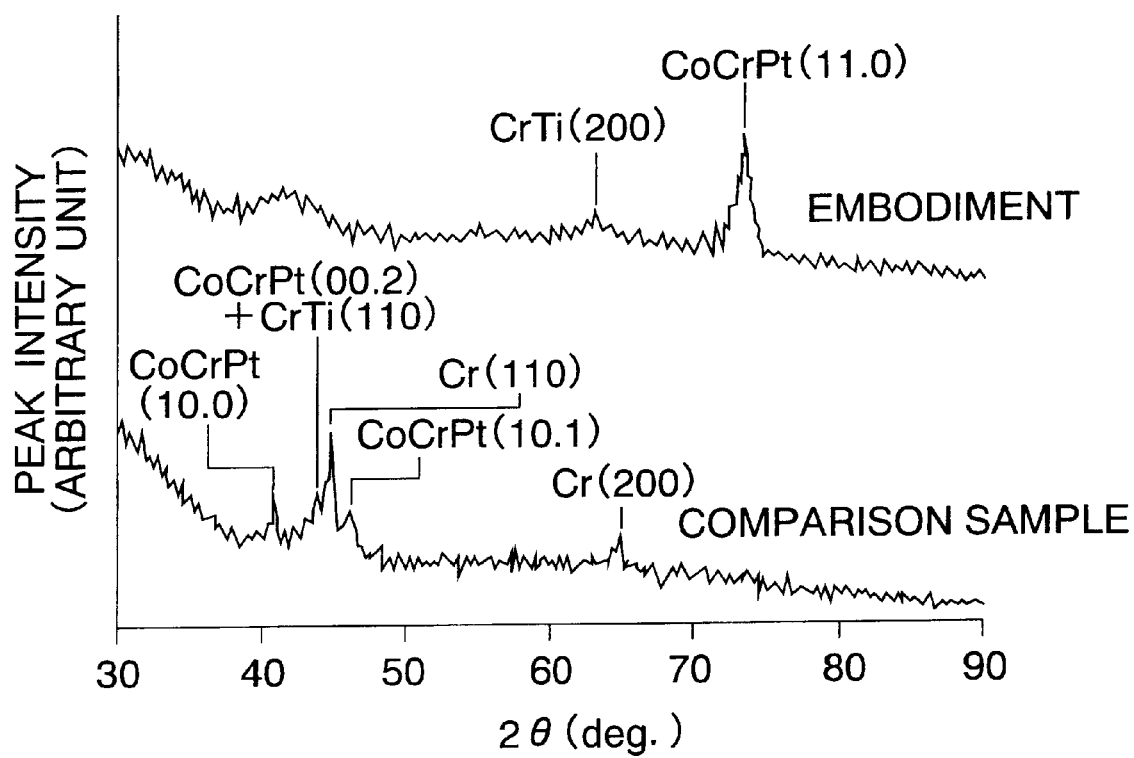
FIG. 6 is a graph showing an X-ray diffraction profile of a magnetic record medium embodying the invention along with a corresponding profile of a medium sample for comparison.
Figure 7:
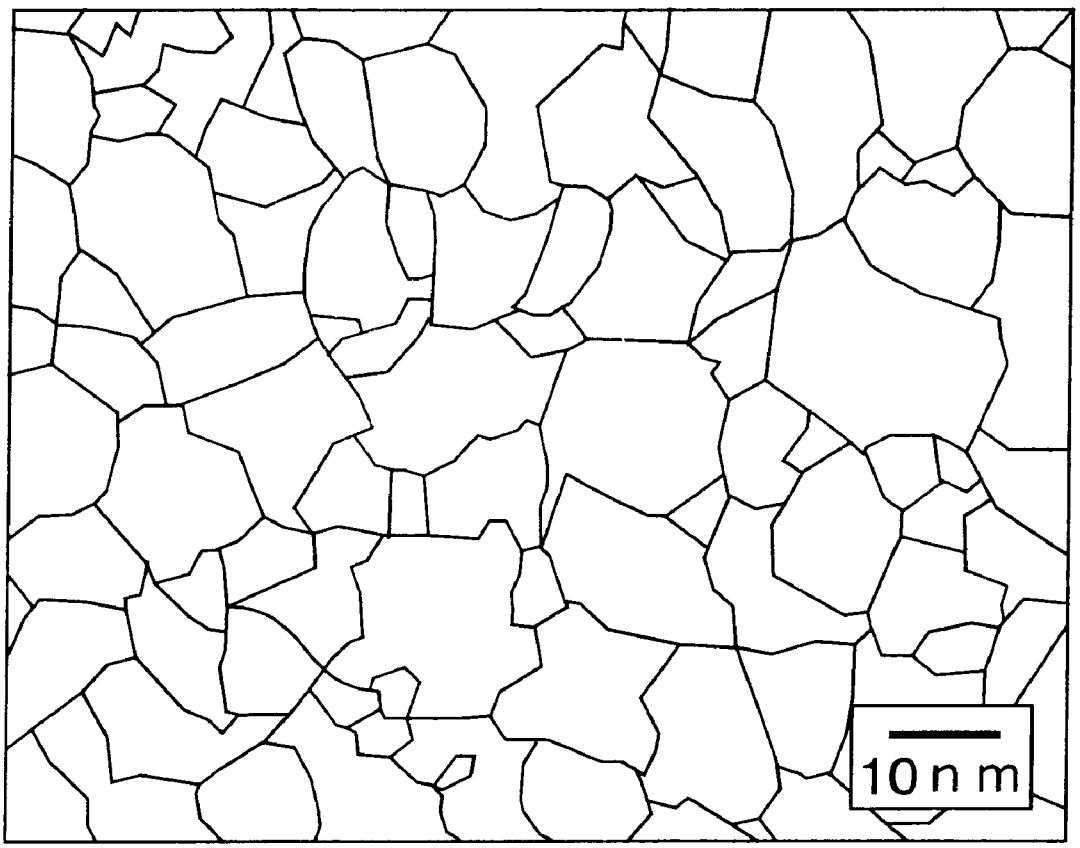
FIG. 7 illustrates a crystal grain boundary network of a magnetic recording medium in accordance with an embodiment of the invention, which was obtained by observation using transmission electron microscope equipment.
Figure 8A:
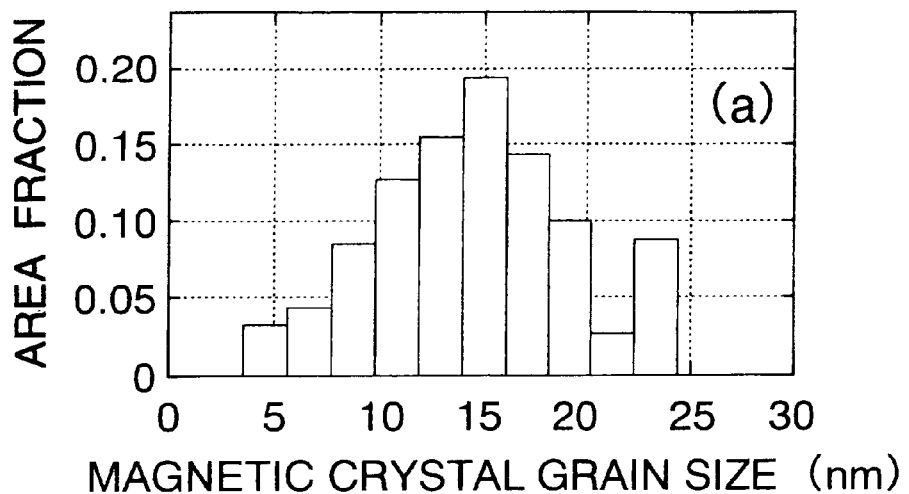
FIGS. 8a and 8b are graphs showing a distribution of area fraction of magnetic crystal grains in a magnetic record medium in accordance with an embodiment of the invention, along with an accumulated area fraction curve thereof.
Figure 8B:
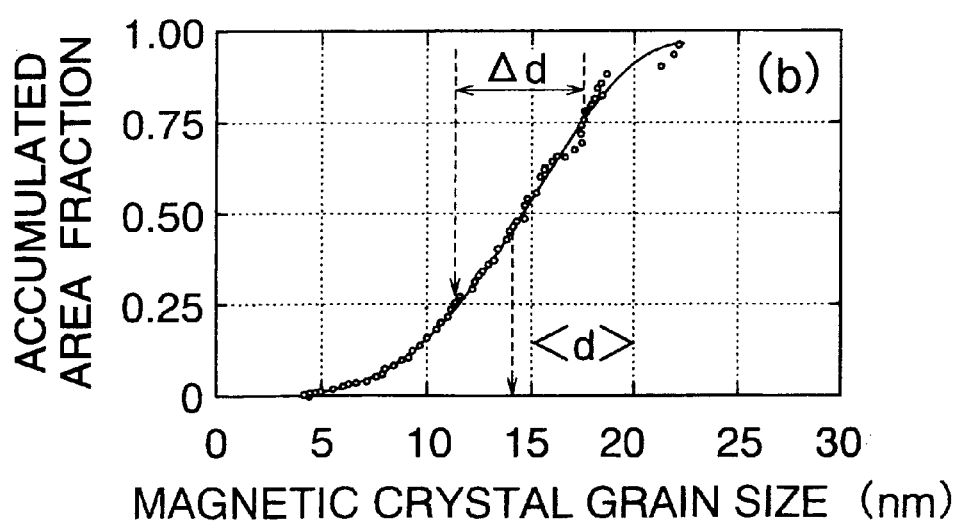

To evaluate the structure of the first underlayer a Ni-35at%Ta alloy alone was first formed by the manufacturing method stated above on the substrate to a thickness of 50 nm. The resulting X-ray diffraction profile of this single-layer film is shown in FIG. 5. No specific diffraction peaks are observable although a broad halo peak is merely seen near a point of 2θ=41.5°. This tells that the Ni-30at%Ta alloy used herein is of the amorphous or microcrystalline structure. In addition, observation of the single-layer film using electron microscope equipment has revealed the fact that while ultafine crystal grains could be seen, any one of them remains 4 nm or less in dimension. Next, an X-ray diffraction profile of a medium with a carbon protective film additionally formed thereon by the manufacturing method stated supra is shown in FIG. 6. Note that the graph of FIG. 6 also shows, as a comparative sample, an X-ray diffraction profile of a certain medium with Cr used for its first underlayer. With the embodiment medium, there can only be seen a (200) diffraction peak from the second underlayer and a (11.0) diffraction peak from the magnetic layer. This demonstrates that the second underlayer is oriented such that the (100) plane lies parallel to the substrate surface whereas the magnetic layer is oriented so that its c axis acting as the magnetization easy axis is within the film surface, which would result from the epitaxial growth. In contrast, the comparison medium is such that its magnetic layer exhibits (00.2) and (10.1) diffraction peaks other than the (10.0) diffraction peak while at the same time permitting presence of those components with the c axis raised from the film plane. Next, determine through electron microscopic observation the average grain size and particle size distribution of the magnetic layers in a way which follows. First, polish the medium to a thickness of several tens of micron in thickness; thereafter, ion-thinning is effected letting each magnetic layer have its film thickness of 10 nm, or more or less. Then, grating image observation is done using transmission electron microscope equipment in the high-resolution mode, thus obtaining a grating image of about two million times in magnification as printed on a sheet of photographic paper. This grating image is then "captured" by scanners for conversion to a corresponding electrical image signal, thereby to provide visual indication of it on the display screen of a personal computer. Next, draw lines along resultant grain boundaries while defining as the boundary a specific portion at which a grating stripe pattern changes (intersects), to thereby produce a crystal grain boundary "network." An exemplary resultant line drawing "work" indicative of the crystal grain boundary network pattern is shown in FIG. 7. A commercially available particle analysis application software was used to compute the area of each "closed-loop" crystal grain pattern in the grain boundary network; then, determine as the particle size of each crystal grain a diameter of a true circle with its area identical thereto. For 100 to 300 crystal grains, the crystal grain size values were computed using the aforesaid procedure. A histogram of grain size frequency of the embodiment medium is shown in FIG. 8a, while a relative characteristic curve (referred to as the "accumulated area ratio curve" hereinafter) is shown in FIG. 8b, which is representative of a relation of crystal grain size values versus those values normalized by the area of all the crystal grains resulting from observation of the area of specified crystal grains less than or equal in dimension to the former—say, the "accumulated area fraction" hereinafter. In this accumulated area fraction curve, let certain crystal grain sizes of 0.5 in accumulated area ratio be defined as the average grain size; define as the grain size distribution a difference between specific crystal grain size of 0.75 in accumulated area ratio and those crystal grain sizes of 0.25 in accumulated area ratio. With the embodiment medium the average grain size was 13.8 nm whereas the grain size distribution was 5.4 nm. In contrast, the comparison medium is such that the average grain size was 17.1 nm whereas the grain size distribution was 7.8 nm. It would thus be appreciated that in the embodiment medium employing Ni—Ta alloy for the first underlayer, the average grain size is reduced by 20% while simultaneously reducing the grain size distribution. Table 1 below indicates some major magnetic properties of both media along with normalized medium noise values.

TABLE 1

| 1st Underlayer | Hc (Oe) | S* | Normalized Medium Noise ($\mu$Vrms · $\mu$m$^{1/2}$/$\mu$Vpp) |
|---|---|---|---|
| Embodiment | Ni – 35 at % Ta | 2570 | 0.76 | 0.0168 |
| Comparison Sample | Cr | 2210 | 0.71 | 0.0221 |

In this table the normalized medium noise is defined as a value obtained by normalizing medium noise, measured with the line recording density set at 260 kFCI, by the square root of both an isolated playback wave output and track width, which value will be employed for evaluation of medium noises hereafter. Apparently, the embodiment medium may be significant both in magnetic coercive force and in S* value and yet less in the normalized medium noise.

From the foregoing discussion, it has become apparent that the use of Ni-35at%Ta alloys for the first underlayer enables miniaturization and uniformalization of crystal grains of the magnetic layer while letting the magnetic layer's crystal grains exhibit the (11.0) orientation, which may in turn permit achievement of low-noise media with Hc and S* much increased. After assembling the medium in the magnetic storage device shown in FIGS. 1a and 1b, measurement is done for evaluation of the read/write characteristics under the condition of 4 Gbit/in$^2$, which revealed the achievability of apparatus that is as high as 1.8 in signal-to-noise (S/N) ratio. It was also affirmed that the friction coefficient stays below 0.3 even after recurrent execution of contact-start-stop (CSS) test procedures for three million times. Further, the bit error number within a coverage of from the inner periphery up to outer periphery of such medium were found to remain 10 bits per plane or below after having repeated head-seek tests while permitting accomplishment of the mean time between failures (MTBF) of more than thirty million hours.

Embodiment 2

Figure 9A:
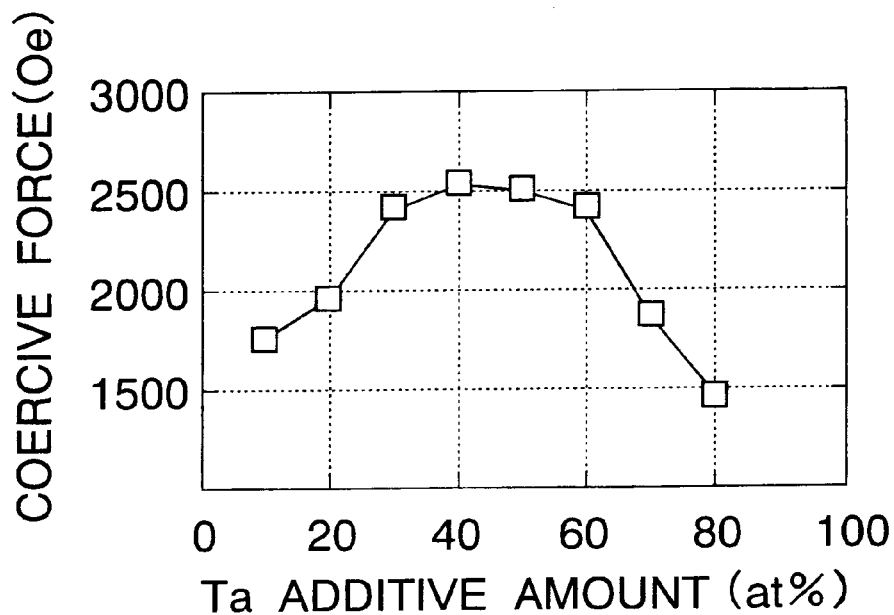
FIGS. 9a–9b are graphs showing a relation of coercive force versus Ta density or concentration in a first underlayer of an embodiment medium of the invention together with a relation of normalized medium noises.
Figure 9B:
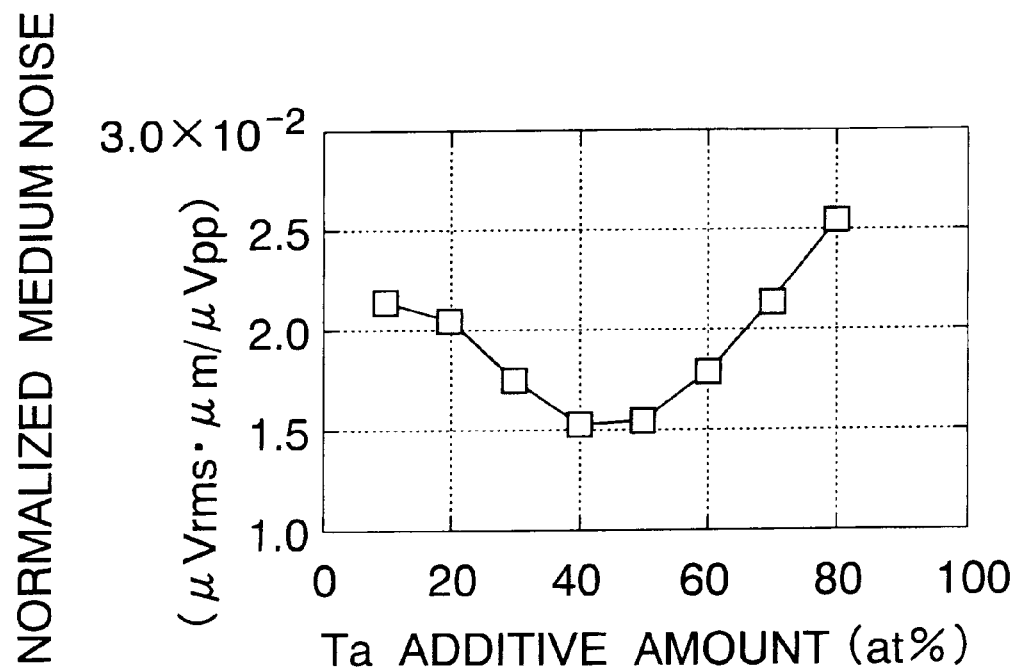
Figure 10:
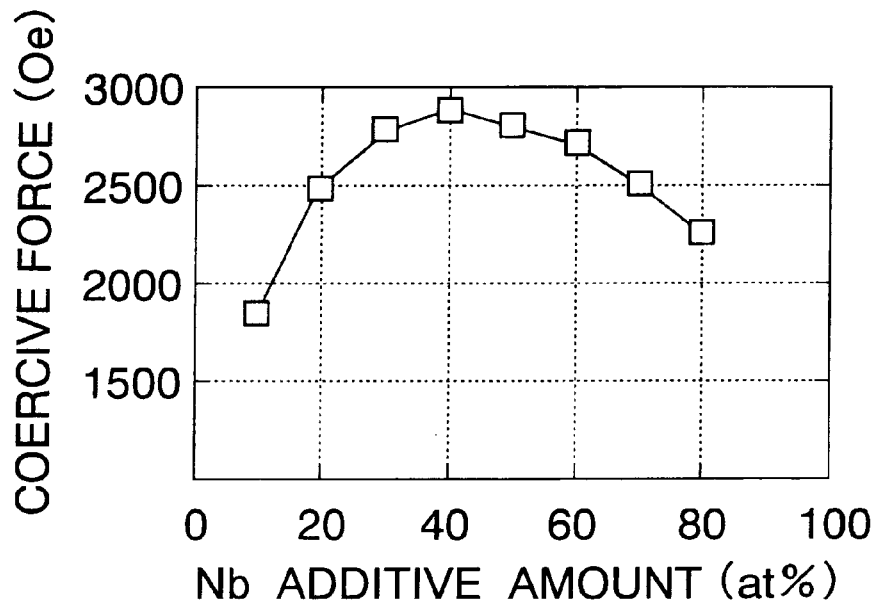
FIGS. 10a–10b are graphs showing a relation of coercive force versus Nb density in a first underlayer of an embodiment medium of the invention along with a relation of normalized medium noises.
Figure 10:
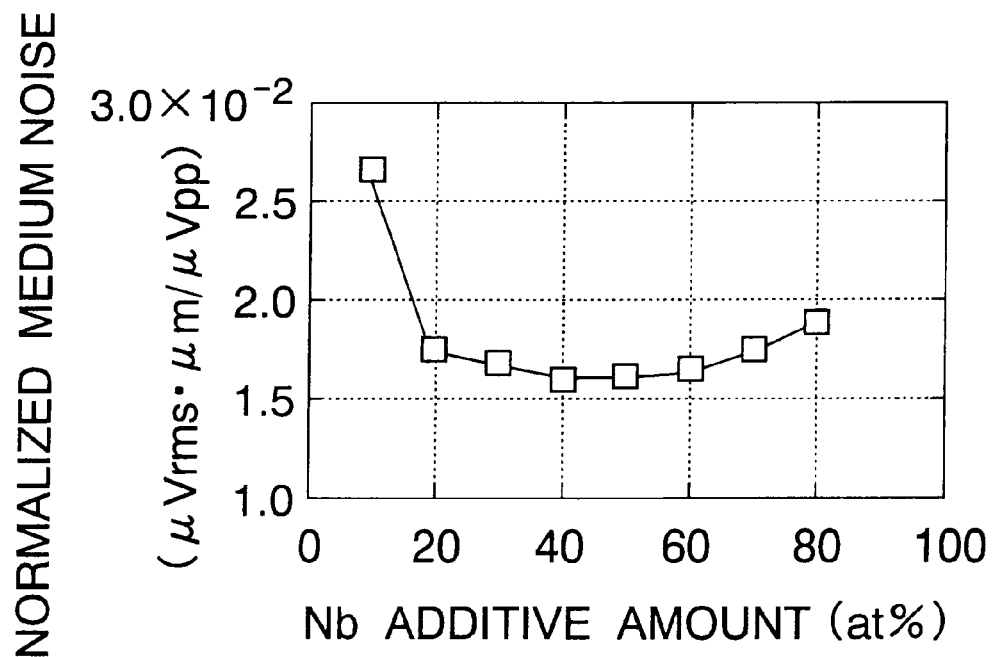

In a magnetic recording medium similar in multilayer structure to the first embodiment discussed above, its first underlayer is modified so that it is made of either a Ni—Ta alloy or Ni—Nb alloy having the thickness of 30 nm, wherein the second underlayer is a Cr-20at%Mo alloy film of 30 nm thick whereas the magnetic layer is a 18 nm thick Co-18at%Cr-8at%Pt-2at%Ta alloy film. A relation of the Ta and Nb concentrations in the first underlayer versus the magnetic coercive force is presented in FIGS. 9a and 10a; a relation of the same versus the normalized medium noise as has been defined in the first embodiment is shown in FIGS. 9b and 10b.

With those media using Ni—Ta alloy for the first underlayer, it was found that when the Ta density is in a range of 30 to 60 at%, the coercive force is as high as 2,400 Oe or greater whereas the normalized medium noise is as low as 0.018 or less. X-ray diffraction measurement demonstrates that with such composition the Ni—Ta alloy exhibited amorphousness or alternatively a microcrystalline structure approximate thereto in nature, and also suggested that the magnetic layer exhibited strong (11.0) orientation. Where the Ta density ranges from 30 to 60at%, the Ni—Ta alloy has been fully crystallized while allowing the magnetic layer to exhibit a mixture phase with crystal grains oriented to (10.1) and (00.2) other than (11.0). Within the above-stated composition range, the saturation flux density of Ni—Ta alloy is as low as 100 Gauss or below, which causes no problems when reduction to practice. Additionally, in order to attain the medium with further enhanced noise reducibility, it is especially preferable that the Ta density be in a range of 35 to 55at%.

With a medium using Ni—Nb alloys for its first underlayer, it has been affirmed that when the Nb density ranges from 20 to 70 at%, the coercive force is as high as 2,400 Oe or more whereas the normalized medium noise is as low as 0.018 or less. X-ray diffraction measurement indicated that within such composition range, the Ni—Ta alloy was of amorphous or microcrystalline structure equivalent thereto, as in the case of the Ni—Ta alloy. With regard to the saturation flux density, it has measured 100G or below, which is fully acceptable in practical implementation of the invention. Especially note that with those media having the Nb density of 30 to 60 at%, the magnetic layer's (11.0) peak intensity is greater by approximately thirty to fifty percent than that of media using Ni—Ta alloys while letting the coercive force be more significant by about 200 to 300 Oe than such media. It is thus desirable in order to obtain an intended medium of higher coercive force that the Nb density be set ranging from 30 to 60at%. When the Nb density is out of this range—namely, below 20at% or above 70at%—Ni—Nb alloy has been fully crystallized resulting in occurrence of extra diffraction peaks from the magnetic layer including (10.1) and (00.2) other than (10.1).

Embodiment 3

A third embodiment of the invention is similar in film structure to the first embodiment stated supra with its first underlayer being made of a Ni-40at%Nb alloy film of 30 nm thick, and with the second underlayer being of 20 nm-thick Cr-20at%V alloy film, and further with the magnetic layer being 14 nm Co-22at%Cr-6at%Pt alloy. A comparative medium sample was prepared with its first underlayer made of V-20at%Ta alloy.

For a single-layer film with only the first underlayer formed on a glass substrate, X-ray diffraction measurement was carried out demonstrating that both Ni—Ta alloy and V—Ta alloy have no peaks other than halo-shaped ones, which in turn suggests that any one of them is of amorphous or microcrystal structure. X-ray diffraction measurement was also applied to a medium with a carbon protective film formed additionally to reveal that the second underlayer of the embodiment medium and magnetic layer exhibited a strong bcc(200) peak and hcp(11.0) peak respectively, whereas the comparison medium is such that the second underlayer and magnetic layer exhibited strong bcc(211) peak and hcp(10.0) peak, respectively. See Table 2 below, which shows the average grain size and grain size distribution as well as normalized medium noises of magnetic layers of the both as calculated in the way discussed previously in the first embodiment.

TABLE 2

| | 1st Underlayer | <d> (nm) | $\Delta$d (nm) | Normalized Medium Noise ($\mu$Vrms · $\mu$m$^{1/2}$/$\mu$Vpp) |
|---|---|---|---|---|
| Embodiment | Ni – 40 at % Nb | 14.9 | 5.4 | 0.0171 |
| Comparison Sample | V – 20 at % Ta | 16.3 | 7.1 | 0.0198 |

The embodiment media are less in average grain size. It was found that resultant grating images of the embodiment media would contain some portions at which neighboring crystal grating stripe patterns intersect each other. This tells that a bicrystal structure is established while causing plural (11.0)-oriented magnetic crystal grains to be epitaxially grown on a single (100)-oriented crystal grain of the second underlayer with the c axis standing ar right angles. The comparison medium sample, by contrast, is such that no such bicrystal structure was observable. This is because the (10.0)-oriented magnetic crystal grains were incapable of growing with all the c axes being simply aligned with an identical direction due to the fact that the second underlayer crystal surface of the comparison medium sample is a two-fold symmetrical (211) plane. Hence, it would be appreciated that the embodiment media are low in noise because presence of such bicrystal structure lets the magnetic crystal grains be further downsized by underlayer crystal grains.

Figure 11:
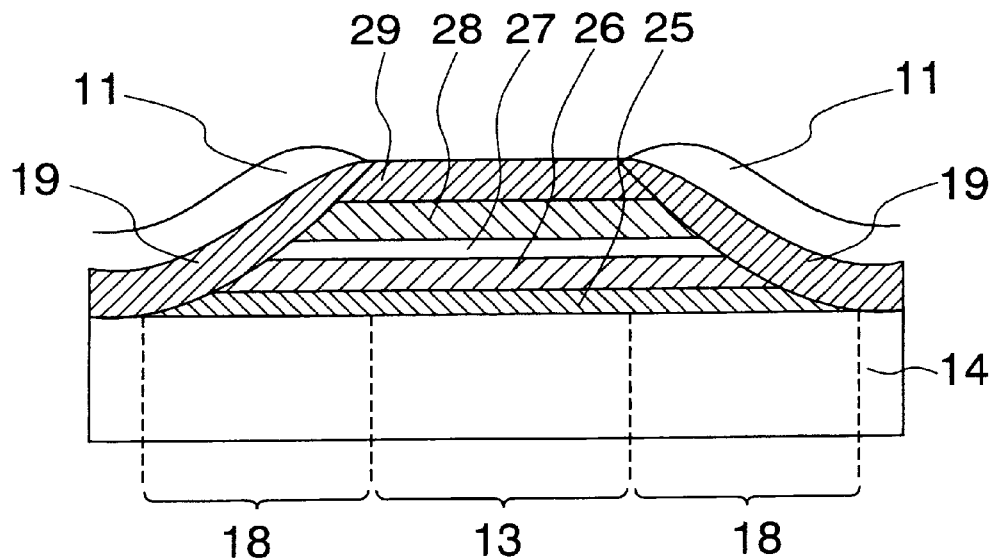
FIG. 11 is a pictorial representation of an exemplary sectional structure of a magnetoresistive sensor unit of a magnetic head assembly used in the magnetic storage apparatus of the invention.

The embodiment medium is built in the magnetic storage device of FIGS. 1a and 1b stated supra in conjunction with the first embodiment, along with a composite head unit using as its read/write head an MR sensor shown in FIG. 11. This sensor is configured including on its gap layer 14 a lamination of a Ta buffer layer 25 which is 5 nm thick, first magnetic layer 26 which is 7 nm thick, 1.5-nm thick Cu intermediate layer 27, 3-nm second magnetic layer 28, and 10-nm Fe-50at%Mn alloy antiferromagnetic layer 29 in this order of sequence. The first magnetic layer 27 is made of a Ni-20at%Fe alloy whereas the second magnetic layer 29 is of Co. The antiferromagnetic layer creates an exchange magnetic field letting magnetization of second magnetic layer 29 be fixed or "pinned" in a single direction. On the contrary, the magnetization direction of first magnetic layer 27 nonmagnetically coupled to second magnetic layer 29 with a nonmagnetic layer sandwiched therebetween may change or vary in the presence of a leakage magnetic field from the magnetic record media, resulting in a change in resistivity. Such resistivity variation with a change in mutual magnetization directions of two magnetic layers 27, 29 is called the "spin valve" effect; in this embodiment, its reproduction or "read" head is configured using a specific magnetic head utilizing this sin valve effect. The embodiment also includes tapered sections similar in structure to the first embodiment discussed previously. Evaluating resultant read/write characteristics under the condition of 5 Gbit/in$^2$ reveals that the device S/N ratio was as high as 2.0.

Embodiment 4

After having heated a NiP-plated Al—Mg alloy substrate (called the "Al substrate" in some cases), the first and second underlayers as well as a magnetic layer plus a protective layer were formed progressively. The first underlayer is a film made of Ni-50at%Nb alloy of 30 nm thick. The second underlayer is a 10-nm thick Cr-20at%V alloy film. The magnetic layer is a 14-nm Co-22at%Cr-6at%Pt alloy film. The protective film is a 10-nm thick carbon film with hydrogen doped thereinto. The first underlayer was fabricated in a chosen gaseous atmosphere using a mixture gas of Ar and 3% of nitrogen added thereto, while a mixture gas of Ar with 20% of hydrogen added was used for fabrication of the protective layer. All the remaining layers were formed in a pure Ar gas. For the magnetic layer formation only, the substrate is applied with a DC bias voltage of −300V. As a comparative sample, a medium was prepared having its first underlayer of a Mo-12at%Y alloy under similar conditions. With only the first underlayer being formed under the same condition stated above, transmission electron microscope (TEM) observation was done affirming that both the Ni—Nb alloy and Mo—Y alloy were of microcrystal structure with grain size of 5 nm or less.

Figure 12:
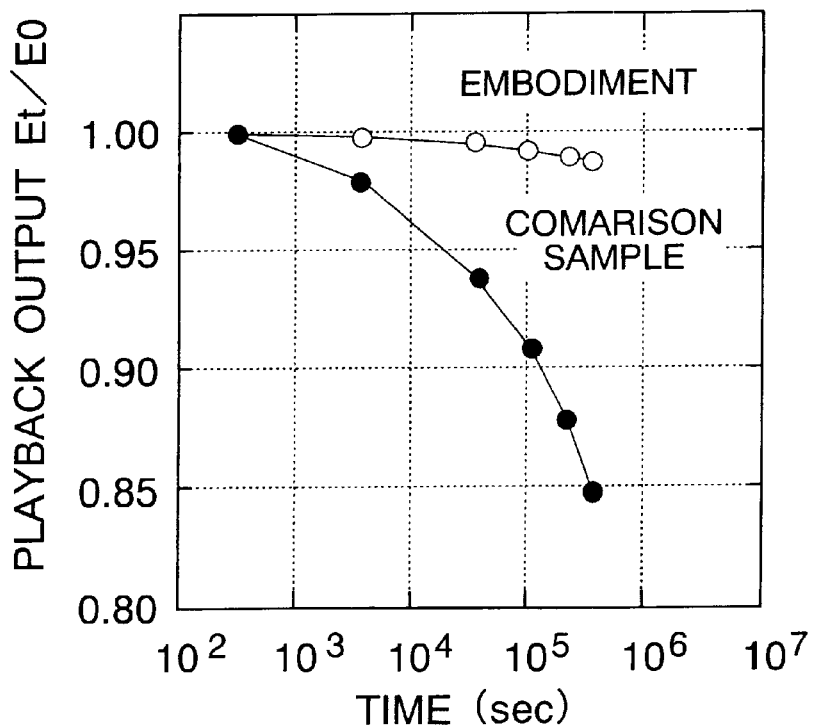
FIG. 12 is a graph showing a change with time of a playback output of an embodiment medium of the invention.

For evaluation of the thermomagnetic saturation characteristics, a change with time of playback output was measured. FIG. 12 demonstrates a change with time of the value obtained from normalization of a playback output Et of a signal recorded at a linear recording density of 260 kFCI by a playback output E0 available just after the recording. With the embodiment medium, the playback output after elapse of 96 hours stays below 2% in attenuation factor (E96h-E0)/E0, whereas the comparison medium is such that the factor was lowered by about 15%. The grain size distribution of the embodiment medium as obtained through the TEM observation procedure was lower by about 20% than that of the comparison medium. It is thus considered that suppression of playback output in the embodiment medium is due to the fact that the grain size uniformalization lets extra-fine magnetic crystal grains disappear. After assembling both the embodiment medium and the spin valve effect type magnetic head stated supra in conduction with the third embodiment in the magnetic storage device of the first embodiment for evaluation of read/write characteristics under the condition of 5 Gbit/in$^2$, it has been found that the device S/N ratio is as high as 2.1. It has been also affirmed that the friction coefficient was below 0.2 even after recurrent execution of CSS tests for three million times.

Embodiment 5

In those media having the film structure similar to that of the first embodiment, a chosen material was formed as its first underlayer to a thickness of 30 nm, the material being added with four kinds of oxides as listed in Table 3 below.

TABLE 3

| 1st Underlayer | Hc (Oe) | S* (nm) | Normalized Medium Noise ($\mu$Vrms · $\mu$m$^{1/2}$/$\mu$Vpp) | Playback Output Attenuation (%) |
|---|---|---|---|---|
| (Ni − 40 at % Ta) −8 mol % Al$_2$O$_3$ | 2540 | 0.74 | 0.0147 | 1.3 |
| (Ni − 40 at % Ta) −12 mol % SiO$_2$ | 2880 | 0.71 | 0.0148 | 1.4 |
| (Ni − 40 at % Ta) −8 mol % Ta$_2$O$_5$ | 2480 | 0.87 | 0.0144 | 1.8 |
| (Ni − 40 at % Ta) −20 mol % TiO$_2$ | 2570 | 0.73 | 0.0145 | 0.6 |
| (Ni − 40 at % Ta) −16 mol % ZrO$_2$ | 2510 | 0.66 | 0.0137 | 1.7 |

Film formation was done by RF sputter techniques in Ar gas atmosphere at 10 mTorr with a crystallized glass substrate used as the substrate. The second underlayer was made of Cr-20at%Ti alloy of 50 nm thick. The magnetic layer was a lamination of two layers of Co-20at%Cr-7at%Ta alloy of 9 nm thick with a 2-nm Cr layer sandwiched therebetween. Other layers overlying the second underlayer were fabricated by DC sputter techniques in pure Ar gas atmosphere at 5 mTorr. Meanwhile, the substrate are heated by lamp heaters so that its temperature reaches 220° C. only after having formed the first underlayer.

The TEM observation results in that the first underlayer in any case was of the amorphous or microcrystalline structure with the average grain size of 4 nm or less. As indicated herein Table 3, it has been found that any medium shown herein exhibited high magnetic coercive force of 2,400 Oe or greater and yet low normalized medium noises of 0.015 or less, which is sufficient for achievement of the recording density of 4 Gbit/in$^2$ or higher. Especially, certain medium having its first underlayer added with Ai$_2$O$_3$ was superior in CSS characteristics. A SiO$_2$-added medium is high in coercive force; with a ZrO$_2$-added medium, enhanced noise reduction was obtained. While a Ta$_2$O$_5$-added medium might be large in S* value, X-ray diffraction measurement indicated that such medium was greater by 30 to 50% than the remaining ones in magnetic layer's hcp(11.0) diffraction peak. It is thus considered that the significance of S* value is due to the fact that the c axis acting as the magnetization easy axis is strongly oriented within the film surface. Table 3 also shows the attenuation factor of a playback output after elapse of 96 hours as discussed in conjunction with the fourth embodiment, suggesting that the factor is noticeably low for the medium with $TiO_2$-added first underlayer.

Also prepared were those media having first underlayers that were formed through fabrication of oxygen-free (Ni-40at%Nb)-16at%Al, (Ni-40at%Nb)-10at%Si, (Ni-40at%Nb)-16at%Ta, (Ni-40at%Nb)-20at%Ti, and (Ni-40at%Nb)-12at%Zr in a gas mixture atmosphere of Ar and 10% of oxygen added. Note that the underlayers were formed by DC sputtering at a gas pressure of 20 mTorr. It has been found that as in the foregoing media, these tested media also offer the coercive force as high as 2,400 Oe or more and normalized medium noises as low as 0.015 or less, which may be sufficient for accomplishment of the recording density of more than 4 $Gbit/in^2$.

Embodiment 6

A sixth embodiment includes its substrate 20 made of chemically strengthen or "reinforced" soda lime glass with washing applied thereto. After having heated the substrate 20 by lamp heaters up to 300° C., a first underlayer 21 was formed thereon, which may be Nb-15at%Si, Zr-15at%Si, Ta-15at%Si, Mo-15at%Si alloy of 50 nm thick. Then, a second underlayer 22, magnetic layer 23, and carbon protective film 24 were formed sequentially in this order. The underlayer 22 was made of Cr-10at%Ti alloy of 20 nm thick, while the magnetic layer 23 was of 18-nm thick Co-20at%Cr-8at%Pt alloy. These layers were progressively formed by DC sputter techniques in an argon atmosphere at 5 mTorr. A medium with traditional structure was prepared as a comparison, which employs Y-25at%Zr alloy as formed on its first underlayer 21 under similar film-formation conditions.

First, single-layer films each having only the first underlayer were formed for effectuation of X-ray diffraction measurements, resulting in that no peaks other than halo-shaped ones were observable. This encourages us to believe that the first underlayers in both cases exhibit an amorphous or microcrystalline structure similar in nature. Next, X-ray diffraction measurement was applied to those media each having a carbon protective film formed thereon. This reveals that with the media embodying the invention, all the CrTi alloy layers each acting as the second underlayer exhibited the (100) orientation whereas the magnetic layers were (11.0)-oriented due to epitaxial crystal growth. In contrast, the comparison medium sample is such that its second underlayer was of (110) orientation whereas the magnetic layer was of (10.1) orientation.

The magnetic properties of the embodiment medium and comparative sample are present in Table 4, along with associative normalized medium noises as measured under the condition of the linear recording density of 230 kFCI. Here, the normalized medium noise is defined as a value obtainable by normalizing media noises by the square root of an isolated read output and track width—this value will be consistently used for evaluation of the medium noise hereafter. The embodiment medium is great both in magnetic coercive force and in squareness S*. It is very likely that this is because the in-plane components of the c axis acting as the magnetization easy axis are increased due to strong (11.0) orientation of each magnetic layer in the embodiment medium.

TABLE 4

| | 1st Underlayer | Hc (kOe) | S* | Normalized Medium Noise ($\mu$Vrms · $\mu m^{1/2}/\mu$Vpp) |
|---|---|---|---|---|
| Embodiment | No – 15 at % Si | 2.21 | 0.76 | 0.0148 |
| | Zr – 15 at % Si | 2.33 | 0.81 | 0.0165 |
| | Ta – 15 at % Si | 2.54 | 0.79 | 0.0171 |
| | Mo – 15 at % Si | 2.52 | 0.78 | 0.0182 |
| Comparison Sample | V – 15 at % Y | 1.76 | 0.73 | 0.0204 |

See FIG. 5, which shows the average crystal grain size and grain size distribution as estimated from the transmission electron microscope (TEM) observation results. Here, the average crystal grain size was defined in a way including the steps of calculating the area of each crystal grain from a grating image obtained by the TEM observation, letting the diameter of a true circle of the same area as this grain be the grain size of each crystal grain, and then computing the average value of them among all the grains under observation. In addition, the resulting standard deviation at this time was defined as the grain size distribution.

TABLE 5

| | 1st Underlayer | <d> (nm) | Δd (nm) | Attenuation (%) |
|---|---|---|---|---|
| Embodiment | Nb – 15 at % Si | 11.5 | 5.3 | 1.7 |
| | Zr – 15 at % Si | 12.2 | 4.1 | 0.7 |
| | Ta – 15 at % Si | 12.4 | 4.2 | 0.9 |
| | Mo – 15 at % Si | 12.7 | 5.8 | 1.2 |
| Comparison Sample | V – 15 at % Y | 14.1 | 8.4 | 5.2 |

Apparently, the embodiment media are about 10–20% smaller in average grain size than the comparative sample medium, and also are 30–50% less in grain size distribution. The embodiment media remain small in normalized medium noise because their magnetic crystal grains are highly miniaturized.

Next, in order to evaluate the thermal fluctuation characteristics, a read output change with time was measured. Note here that to emphasize such change with time, the measurement was done using those media that are the same in film arrangement as stated above with only the magnetic film thickness being set at 14 nm. Let the attenuation ratio be (E0-E96h)/E0, where "E0" is the read output of a signal recorded with the recording density of 230 kFCI which output was obtained immediately after recording, and "E96h" is the read output after elapse of 96 hours from completion of recording.

Although as shown in Table 5 the comparison medium was as large as 5.2% in attenuation ratio, all the embodiment media were less than or equal to 2% in attenuation ratio, which guarantees sufficient stability against thermal fluctuation. Presumably, this is because the embodiment media stay smaller in grain size distribution and in turn less in presence of micro-crystal grains with extremely strong thermal-fluctuation affectability.

After having coated lubricant 24, the resultant medium were assembled along with the MR head in a magnetic storage device for evaluation of read/write characteristics to find that the device S/N ratio as high as 1.8 was obtained.

Further, the contact-start-stop (CSS) test was done to reveal the fact that the fraction coefficient was 0.3 or below even after effectuation of such CSS tests for three million times. Additionally, the head seek tests were performed five million times covering from the inner periphery to outer periphery of the medium, demonstrating that the bit error number was 10 bits/plane or less and thus could guarantee the obtainability of the mean time between failures (MTBF) of thirty million hours or greater.

Embodiment 7

A magnetic recording medium of this embodiment is similar to the embodiment 6 with the first underlayer being made of Zr-20at%Si. As a sample for comparison, a medium is used having its first underlayer of a Cr-30at%Si alloy. To analyze the first underlayer film structure, a glass substrate was heated using lamp heaters up to 200° C.; then, only Zr-20at%Si alloy and Cr-30at%Si alloys were formed to a thickness of 30 nm.

X-ray diffraction measurement suggested that only a halo-shaped peak was observed from any one of single-layer films, which ensures that such are of the amorphous or microcrystal structure. Then, the first underlayer was formed under the same condition as stated above. Next, several layers were formed progressively including a Cr-15at%Mo alloy underlayer of 30 nm thick, a magnetic layer of a Co-19at%Cr-10at%Pt-2at%Ta alloy of 22 nm thick, and a 10-nm thick carbon protective film.

The magnetostatic characteristics and normalized medium noise values of them are shown in Table 6. The embodiment medium is higher in coercive force squareness ratio S* and yet lower in normalized medium noise than the comparison medium sample. When estimating the average grain size by use of a method similar to that stated in the first embodiment, it has been found that the resultant average grain size of the embodiment medium was 12.2 whereas that of the comparison medium sample was 15.2—the former is about 20% smaller than the latter. This suggests that the attainability of noise reduction of the embodiment medium is due to miniaturization of grain size or dimension.

Also note that while the embodiment medium was such that the magnetic layer contains therein observable bicrystal structures with the c axes of neighboring crystal grains being at right angles to each other, no such structures were found with the comparison medium sample. With the embodiment medium, the underlayer crystals are specifically oriented so that the four-fold symmetric (100) plane lies parallel to the substrate thereby allowing magnetic crystals to epitaxially grow with their c axes being directed to two perpendicular directions. Hence, a plurality of magnetic crystals grow on a single underlayer crystal resulting in the magnetic crystal grain size being further downsized to be even smaller than the grain size of such underlayer crystal. In contrast, the comparison medium sample was such that its underlayer surface becomes the two-fold symmetric (211) plane causing the c axes of those magnetic crystals grown thereon to be simply directed toward the same direction. Due to this, any bicrystal structure is no longer established letting resultant crystal grain size remain the same as the underlayer crystal grain size. It appears that the comparison medium was smaller in grain size because the magnetic crystal grains have the bicrystal structure.

After having coated lubricant, the medium was assembled in a magnetic storage device similar to the first embodiment for measurement of resultant read/write characteristics with the line recording density set at 240 kCFI and with track recording density of 16 kTPI, which resulted in achievement of the device S/N ratio as high as 1.7.

TABLE 6

|  | 1st Underlayer | Hc (kOe) | S* | Normalized Medium Noise ($\mu$Vrms · $\mu$m$^{1/2}$/$\mu$Vpp) |
| --- | --- | --- | --- | --- |
| Embodiment | Zr – 20 at % Si | 2.21 | 0.76 | 0.0188 |
| Comparison Sample | Cr – 30 at % Si | 2.19 | 0.69 | 0.0224 |

Embodiment 8

This embodiment employed its first underlayer made of a Nb—Si alloy with the Si concentration being varied within a range of 0 to 45 at%. After having formed the first underlayer on a tempered glass substrate with alkali-washing applied at room temperatures, the substrate was heated up to 250° C. for successive fabrication of a Cr-10at%W alloy underlayer and Co-16at%Cr-9at%Pt-4at%B alloy magnetic layer as well as carbon protective film. The first underlayer was formed in a mixture gas atmosphere containing therein an argon gas with 2% of nitride added, while all the remaining layers were formed in a pure argon gas.

A single-layer film of only the Nb—Si alloy was fabricated on the glass substrate to a thickness of 50 nm at room temperatures. The subsequent X-ray diffraction measurement revealed the fact that although no clear diffraction peaks were observable when the Si density ranges from 5 to 40at%, a "crisp" diffraction peak could be seen near the bcc(110) peak of pure Nb when the Si density was out of the range—namely less than 5at% or beyond 40at%—which in turn encourages us to believe that the Nb—Si alloy is crystallized outside the range of 5 to 40at%.

Figure 13:
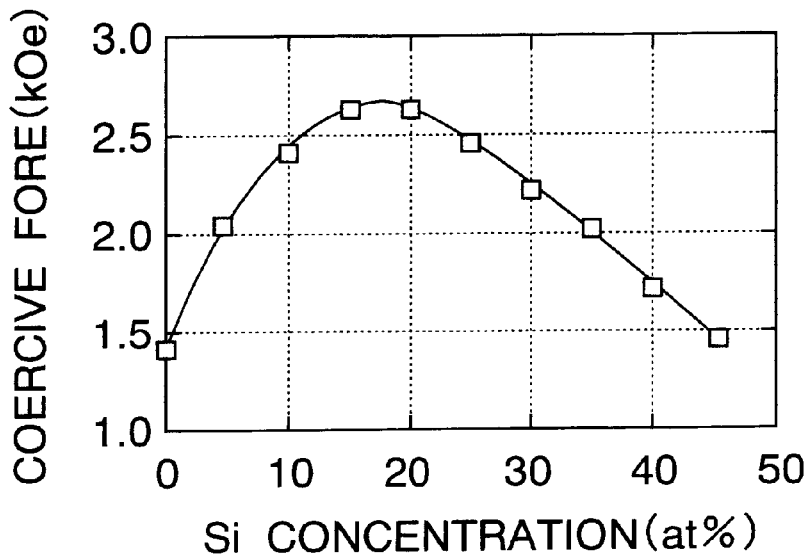
FIGS. 13a–13b are graphs showing a relation of coercive force versus Nb density in a first underlayer of an embodiment medium of the invention along with a relation of normalized medium noises and the Si density.
Figure 13:
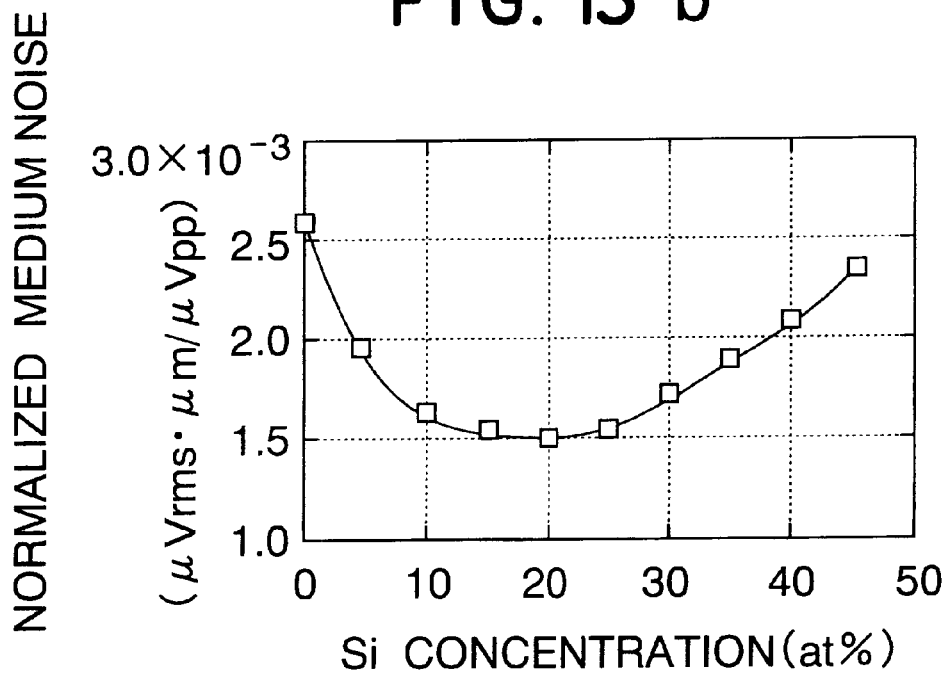

The medium with the carbon protective film fabrication completed was then subject to measurement with the line recording density set at 240 kFCI, obtaining the results shown in FIGS. 13a and 13b, wherein FIG. 13a shows a relation of the magnetic coercive force versus Si density whereas FIG. 13b is a relation of normalized medium noise and Si density. It is apparent from viewing these graphs that the coercive force is as high as 2 kOe within the Si density value range of 5 to 35at% while at the same time allowing the normalized medium noise to stay below 0.02 in this zone. Especially, when the Si density is in a range of 10 to 25at%, the resulting magnetic grains may best be downsized minimizing medium noises preferably.

After having coated with lubricant, the medium was assembled in a magnetic storage device similar to the first embodiment device for evaluation of read/write characteristics through the CSS test, which tells that the friction coefficient stays below 0.3 even after repeating of CSS test procedures for three million times. Additionally, head seek tests were done five million times covering from the inner periphery to outer periphery of the medium. This well demonstrated that the bit error number is 10 bits/plane or less to ensure the obtainability of thirty million hours or more in MTBF.

Embodiment 9

A crystallized glass substrate was prepared. A Ta-10at%Si alloy is fabricated thereon in various kinds gasses listed in TABLE 7, providing the first underlayer. Several layers were formed sequentially in a way such that a Cr-10at%V alloy underlayer is formed to a thickness of 20 nm, then a Co-18at%Cr-8at%Pt-2at%V alloy magnetic layer was formed, and further a carbon protective film was formed. A medium was also prepared with its first underlayer made of pure Ta for use as a comparative sample.

Refer to table 7 below. This shows each medium's gas composition and magnetic characteristics obtained during formation of its first underlayer along with the resultant peel-off ratio obtained through peeling test procedures. The peeling test was done in a procedure which follows. First, a diamond pen tool was used to define or "mark" a mesh pattern having a matrix of 5 rows and 5 columns of square reticle areas of 2 mm long at each side within a 10-mm long square area on each medium surface; then, an adhesive tape was applied thereto. After having left it in the atmospheric air at room temperatures, the tape is removed for measurement of the area ratio of the 10-mm square region with the mesh pattern marked, which ratio was defined as the peel-off ratio. The higher the peeloff ratio, the better the adhesion.

TABLE 7

| | 1st Underlayer | Gas used | HC (kOe) | Peeloff Ratio (%) |
|---|---|---|---|---|
| Embodiment | Ta – 10 at % Si | Ar | 2.31 | 0 |
| | | Ar + 10 % O$_2$ | 2.28 | 0 |
| | | Ar + 20 % O$_2$ | 2.19 | 0 |
| | | Ar + 10 % N$_2$ | 2.25 | 0 |
| Comparison Sample | Ta | Ar | 1.18 | 100 |
| | | Ar + 10% O$_2$ | 1.88 | 92 |
| | | Ar + 20% O$_2$ | 1.98 | 80 |
| | | Ar + 10% N$_2$ | 2.09 | 84 |

It is apparent from Table 7 that the embodiment medium exhibited their magnetic coercive force as high as 2 kOe or more irrespective of the kind of a film fabrication gas used. Concerning the peeloff ratio, where the first underlayer was made of pure Ta as in the comparison medium samples, the ratio was as high as 80% or more irrespective of the kind of a gas used, which tells that the adhesion is very bad. On the contrary, with the embodiment medium having the first underlayer with 10at%-Si added thereto, the peeloff ratio was found to be 0% with respect to all of them, which indicates that the adhesion is enhanced. In the case the first underlayer was made of Ta-10at%Si alloy as in one embodiment medium of Table 7, it will no longer required that the underlayer be oxidized or nitrided for adhesion enhancement purposes.

After having coated with lubricant, the medium was assembled in a magnetic storage device similar to the first embodiment for evaluation of read/write characteristics through CSS test procedures under the conditions of the line recording density of 255 kFCI with track density set at 15.6 kTPI, resulting in the device S/N ratio being as high as 1.8. It has also be found that the friction coefficient stays below 0.3 even after recurrent effectuation of CSS tests for three million times. Additionally, head seek tests were performed five million times covering from the inner periphery to outer periphery of the medium to find that the bit error number was 10 bits/plane or less, which guarantees the obtainability of thirty million hours or more in MTBF.

Embodiment 10

Nb-25at%Si, Zr-25at%Si, Ta-25at%Si and Mo-25at%Si alloys were used for the first underlayer, which were fabricated by a procedure which follows. First, glass substrates were prepared, on which the four kinds of first underlayers were fabricated at room temperatures to a thickness of 30 nm, respectively. Then, the substrates were heated up to 300° C. for progressive formation of a Cr layer of 20 nm thick, Cr-10at%Ti alloy film of 20 nm thick, Co-18at%Cr-10at%Pt-2at%Ti alloy magnetic layer of 18 nm thick, and 10-nm carbon protective film in this order. Here, in order to further strengthen the (11.0) orientation of the magnetic layer, the second underlayer was of a lamination of a Cr film and Cr-10at%Ti alloy film.

Table 8 below shows the magnetostatic characteristics of each embodiment medium along with normalized medium noises as measured with the line recording density set at 255 kFCI. Grain size analysis was also performed in a way similar to that of the first embodiment stated previously, obtaining the average grain size of crystal grains inside the magnetic layer of each medium as well as grain size distribution, which are shown in Table 9 below. Also indicated therein is the ratio of the (11.0) diffraction peak intensity ICo(11.0) of a Co-alloy magnetic layer versus the (10.1) diffraction peak intensity ICo(10.1) as obtained from an X-ray diffraction profile.

TABLE 8

| | 1st Underlayer | Hc (kOe) | S* | Normalized Medium Noise ($\mu$Vrms · $\mu$m$^{1/2}$/$\mu$Vpp) |
|---|---|---|---|---|
| Embodiment | Nb – 20 at % Si | 2.21 | 0.76 | 0.0171 |
| | Zr – 20 at % Si | 2.33 | 0.81 | 0.0188 |
| | Ta – 20 at % Si | 2.54 | 0.79 | 0.0193 |
| | Mo – 20 at % Si | 2.52 | 0.78 | 0.0196 |

TABLE 9

| 1st Underlayer | ICo(11.0)/ICo(10.1) | <d> (nm) | Δd (nm) |
|---|---|---|---|
| Nb – 20 at % Si | 6.5 | 12.3 | 6.5 |
| Zr – 20 at % Si | 8.2 | 14.8 | 5.4 |
| Ta – 20 at % Si | 9.4 | 15.6 | 5.1 |
| Mo – 20 at % Si | 15.7 | 16.5 | 7.9 |

Apparently, the medium with its first underlayer made of Nb—Si alloy is smallest in average grain size with noises lowered. The grain size distribution is noticeably low in cases where the Zr—Si alloy and Ta—Si alloy were used, which in turn enables achievement of higher magnetic coercive force square ratio. Note especially that the Mo—Si alloy offers much increased Co(11.0) orientation of the magnetic layer, leading to enhancement of coercive force.

After the peeling test it was found that all the media offered excellent adhesion of 0%. Then, in order to evaluate the thermal fluctuation characteristics, a medium with a 10-nm thick magnetic film was formed under the same conditions as stated above; next, the attenuation ration of read outputs was obtained by a scheme similar to that in the first embodiment. The resultant attenuation ratio was 2% or below for all the media, which guarantees establishment of sufficient stability against thermal fluctuation. However, for those media using the first underlayers made of Zr—Si alloy and Ta—Si alloy with extremely low grain size distribution, the attenuation ratio was at almost 0%. This tells that the stability against thermal fluctuation is superior.

After having coated chosen lubricant on the embodiment medium, the resultant medium was assembled in a magnetic storage device together with the "spin valve" type magnetic head mentioned in Embodiment 3. After measurement of read/write characteristics under the condition of the recording density of 5 Gb/in², the device S/N ratio was found to be as high as 1.9. Also, the friction coefficient was at 0.3 or less even after recurrent effectuation of CSS tests for three million times. Additionally, head seek tests were performed five million times with respect to disk surface areas covering from the inner periphery to outer periphery, indicating that the resulting bit error number was 10 bits/plane or less, which thus guarantees obtainability of thirty million hours or more in MTBF.

The magnetic recording medium in the above embodiment may offer medium noise reducibility and also suppressibility of read output attenuation due to thermomagnetic relaxation. Use in combination of such magnetic recording medium and MR heads may enable achievement of the intended magnetic storage device or apparatus having the recording density of more than 4 Gbit/in² with MTBF enhanced up to thirty million hours or longer.

What is claimed is:

1. A magnetic recording medium comprising:

a substrate;

one or more underlayers formed on said substrate; and a magnetic layer formed on said one or more underlayers, wherein at least one of the underlayers is an amorphous or micro-crystalline material consisting essentially of nickel (Ni) and at least one kind of element selected from the group consisting of niobium (Nb) and tantalum (Ta).

2. The magnetic recording medium according to claim 1, wherein the amorphous or microcrystalline material further contains therein at least one kind of oxide as selected from the group consisting of $Al_2O_3$, $SiO_2$, $Ta_2O_5$, $TiO_2$, and $ZrO_2$.

3. The magnetic recording medium according to claim 2, wherein the underlayer is less than or equal to 8 nanometers (nm) in average crystal grain size.

4. The magnetic recording medium according to claim 3, wherein an underlayer with a substantially body-centered cubic lattice structure is formed between the underlayer with Ni and the magnetic layer, and wherein said magnetic layer is an alloy having substantially a hexagonal close packed lattice structure with cobalt (Co) as its main component.

5. A magnetic recording medium having on a substrate a magnetic layer with one or a plurality of underlayers residing between them, wherein at least one of the underlayers comprises an amorphous or micro-crystalline material containing as its principal component at least one kind of element selected from the group consisting of niobium (Nb), zirconium (Zr), tantalum (Ta) and molybdenum (Mo) and also containing silicon (Si) therein.

6. The magnetic recording medium according to claim 5, wherein a density of Si contained in the underlayer containing as its main component at least one element selected from the group consisting of Nb, Zr, Ta, and Mo and also containing Si is substantially in a range of from 5 atomic percent (at%) to 35 at%.

7. The magnetic recording medium according to claim 6, wherein the underlayer containing as its main component at least one element selected from the group consisting of Nb, Zr, Ta, and Mo and also containing Si is less than or equal to 8 nm in average crystal grain size.

8. The magnetic recording medium according to claim 7, wherein an underlayer having a substantially body-centered cubic lattice structure is formed between the underlayer containing as its main component at least one element selected from the group consisting of Nb, Zr, Ta, and Mo and also containing Si and the magnetic layer, and wherein said magnetic layer is an alloy having substantially a hexagonal closest packed lattice structure with Co being as its main component.

* * * * *